(12) United States Patent
Khare et al.

(10) Patent No.: US 8,132,133 B2
(45) Date of Patent: Mar. 6, 2012

(54) AUTOMATED ISOLATION OF LOGIC AND MACRO BLOCKS IN CHIP DESIGN TESTING

(75) Inventors: Animesh Khare, Bangalore (IN); Narendra Keshav Rane, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 812 days.

(21) Appl. No.: 12/196,840

(22) Filed: Aug. 22, 2008

(65) Prior Publication Data

US 2010/0050137 A1 Feb. 25, 2010

(51) Int. Cl.
*G06F 17/50* (2006.01)
(52) U.S. Cl. ........ 716/104; 716/106; 716/111; 716/136; 716/139
(58) Field of Classification Search .......... 716/100–107, 716/111–112, 136–139
See application file for complete search history.

(56) References Cited

U.S. PATENT DOCUMENTS

| | | | |
|---|---|---|---|
| 7,926,012 B1 * | 4/2011 | Parimi et al. .................. | 716/106 |
| 2004/0040006 A1 * | 2/2004 | Arakawa .......................... | 716/8 |
| 2007/0079200 A1 * | 4/2007 | Tabatabaei et al. ........... | 714/733 |

* cited by examiner

*Primary Examiner* — Paul Dinh
(74) *Attorney, Agent, or Firm* — Grant A. Johnson; Roy W. Truelson

(57) ABSTRACT

A method and system for testing a synthesized design of a semiconductor chip. The method includes inputting a macro test Input/Output (I/O) name of the semiconductor chip, along with associated attributes and a netlist, where the netlist is a synthesized design of the semiconductor chip. The method includes tracking the macro test I/O to a chip test I/O. The method further includes detecting mismatches between attributes associated with the macro test I/O and the chip test I/O. Subsequently, reporting any mismatches between the attributes associated with the macro test I/O and the chip test I/O.

12 Claims, 6 Drawing Sheets

AUTOMATED ISOLATION OF LOGIC AND MACRO BLOCKS IN CHIP DESIGN TESTING

TECHNICAL FIELD

This disclosure relates generally to integrated circuit (semiconductor chip) testing and more specifically to a Design-For-Test (DFT) methodology for testing an integrated circuit.

BACKGROUND OF THE INVENTION

Testing semiconductor chip designs presents a formidable challenge to the chip designers. Testing in silicon is an expensive process, and thus must be reserved to the last stages of design work. Because a chip design involves millions of individual transistors, design simulation is likewise difficult, with the added issue of reliability of results, given the highly complex nature of the systems under test.

Design-For-Test (DFT) is a technique that adds testability features to a semiconductor chip. Unlike functional testing, which seeks to determine whether components perform according to their specifications, DFT seeks to determine whether the system has been configured and assembled correctly, based on the low-level building blocks set out in a system netlist. A netlist is typically a text file representation of a circuit which emphasizes the connections between the different circuit elements, perhaps independently of the physical packages constituting the actual components in the circuit. Thus, DFT assumes that the netlist is correct, and it seeks to determine whether the system has been assembled, or manufactured, according to the netlist provided. A key advantage of DFT is that is permits focusing on relatively high-level test Input/Output (I/O)'s rather than trying to access functions at the gate level, which is typically buried deep within current designs.

Conventionally, DFT methodologies include DFT synthesis followed by DFT verification, to check a synthesized design for compliance with appropriate test guidelines. During the DFT synthesis phase, test structures are inserted into the logically synthesized design, based, for example, on the netlist. Insertion of test structures into the netlist is controlled by a test descriptive file, created by the designer.

As noted above, DFT synthesis is performed by Electronic Design Automation (EDA) test tools. A number of commercially available tools, such as the Encounter Test and Diagnostic Tool, from Cadence Design Systems, and DFT Max from Synopsys, Inc., have been found suitable by those in the art for this task. The designer prepares a circuit for test by inserting test structures into a chip, which provide access points at which the designer checks for expected values of input or output. Test structures inserted into a chip during DFT synthesis are verified for compliance with test guidelines during DFT verification, DFT synthesis and verification involve examining functional relationships involving macros, which are pre-synthesized reusable circuit blocks, which include complex circuit devices such as memory units, Phase Locked Loops (PLL) or High Speed SERDES (Serializer/Deserializer) cores (HSS Cores) etc. DFT testing for a chip including macros requires checking whether a given chip test I/O properly controls a macro I/O, a determination that in turn requires that a the path between I/Os be clearly defined, or isolated. Test I/O ports have associated attributes called test flags, and such test flags should match with test flags associated with the chip test I/O, where the chip test I/O controls the macro test I/O.

A disadvantage with the tools and methods available is that they tend to generate indistinguishable errors during DFT verification, meaning errors that cannot be characterized easily. Such disadvantages are often attributable to errors in the test descriptive file, and they produce mismatches between attributes associated with the test I/O of a macro and those associated with a chip test I/O. A further disadvantage with the available tools is that test designers/engineers are required to manually browse through the netlist using trail and error to identify errors, which is a time-consuming and cumbersome process. Moreover, available chip test tools offer no provision for checking and reporting such mismatches.

Thus, there remains a need for technology that will enable test designers to perform DFT testing that is both rapid and accurate.

SUMMARY OF THE INVENTION

An embodiment of the invention addresses a method for testing a semiconductor chip after design-for-test (DFT) synthesis of a circuit design, in which DFT synthesis is followed by DFT verification. The method includes inputting a set of parameters related to a macro test Input/Output (I/O) on the semiconductor chip, the set of parameters include the macro test I/O name together with associated attributes and a netlist, where the netlist is a synthesized design of the semiconductor chip. The method includes tracking the macro test I/O vis-a-vis a chip test I/O in the netlist. Further, the method includes determining mismatches between the attributes associated with the macro test I/O and attributes associated with the chip test I/O. Subsequently, the method reports any mismatches detected between the attributes associated with the macro test I/O and the chip test I/O.

In a further embodiment of this disclosure is a system for implementing a step of design-for-test methodology for testing a semiconductor chip. The system includes storage, processing and display modules, operating cooperatively in a design-for-test system, generally operating between a DFT synthesis module and a DFT verification module. The storage module is configured to store a set of parameters related to a macro test Input/Output (I/O) of the semiconductor chip. These parameters include a macro test I/O name, a first set of attributes associated with the macro test I/O and a netlist. The processing module is coupled to the storage module, and it is configured to track each macro test I/O to a chip test I/O, the chip test I/O being included in the netlist. The processing module is further configured to determine mismatches between the first set of attributes associated with the macro test I/O and a second set of attributes associated with the chip test I/O. A display module is coupled to the processing module, and it is configured to display the mismatches identified by the processing module.

DETAILED DESCRIPTION OF THE INVENTION

The following detailed description is made with reference to the figures. Preferred embodiments are described to illustrate the invention, not to limit its scope, which is defined by the claims. Those of ordinary skill in the art will recognize a variety of equivalent variations on the description that follows.

Figure 1:
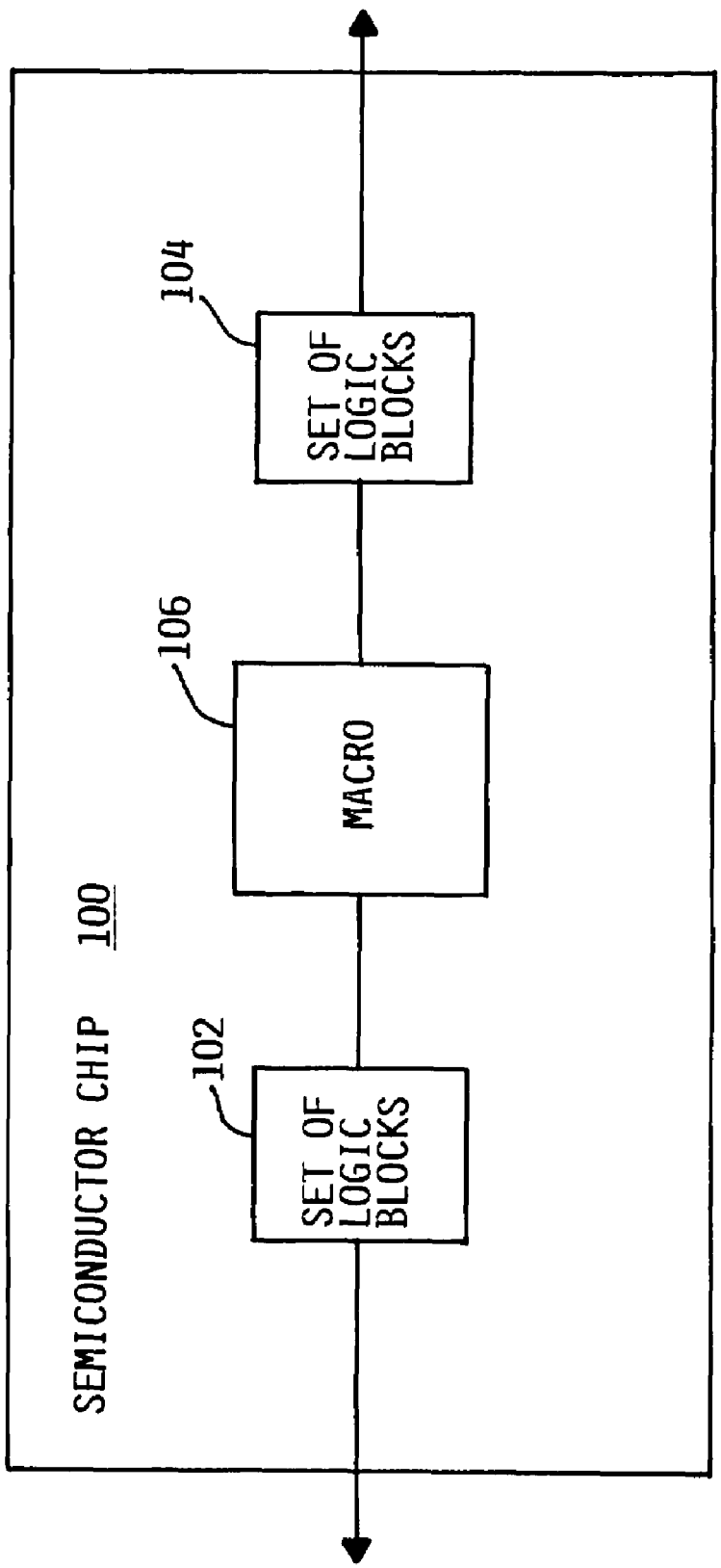
FIG. 1 is a block diagram of a semiconductor chip including a macro and a set of logic blocks.

Referring now to the drawings, FIG. 1 sets out a block diagram of an embodiment of a semiconductor chip 100. The semiconductor chip 100 includes a set of logic blocks 102, a set of logic blocks 104, and a macro 106, the macro 106 being a pre-synthesized reusable circuit block (typically referred by one skilled in the art as a number of circuit blocks) having test Inputs/Outputs (I/O)s. Test structures are introduced into the semiconductor chip 100 to render the semiconductor chip 100 fully testable. Test structures can include but are not limited to a test I/O, a pseudo random pattern generator or any boundary scan logic. For convenience of explanation, FIG. 1 is shown having the macro 106, with the set of logic blocks 102 and 104 on either side. In an actual operational embodiment, the semiconductor chip 100 includes a large number of macros and logic blocks coupled to each other.

The test I/O(s) of the macro 106 are supplied by attributes, hereinafter also referred to as test flags, which indicate the intended test function of primary input/primary output ports of the macro 106 in test mode. Test input ports of the macro 106 are linked to the set of logic blocks 102, and in similar fashion, test output ports of the macro 106 are linked to the set of logic blocks 104. The macro 106 can include any of a number of conventional functional circuit elements, such as a phase locked loop, a memory unit, or other elements known in the art.

The goal of the test procedure of this disclosure is referred to as an "isolation check" of each test I/O of the macro 106 to a chip test I/O. "Isolation" as used here refers to forming a link between the test I/O of the macro 106 and the chip test I/O. Hence, the isolation check involves verifying the link between the test I/O of the macro 106 and the chip test I/O, by comparing the attributes associated with the test I/O of the macro 106 and the chip test I/O. Each test I/O of the macro 106 may be isolating to a multitude of chip test I/O(s). The test procedure checks for isolation of a test I/O of the macro 106 to a number of chip test I/Os and the procedure is repeated for all the test I/Os of the macro 106. The chip test I/O can be any of a number of test I/Os known in the art, such as a bidirectional I/O cell or unidirectional I/O cell.

Figure 2:
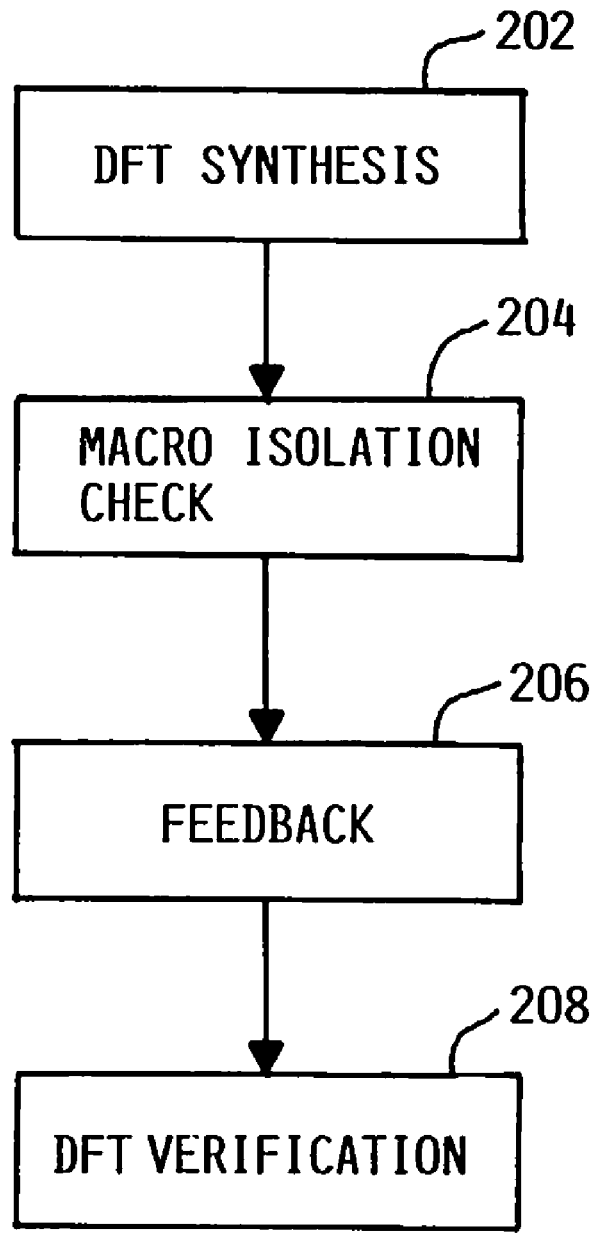
FIG. 2 is flow chart of an embodiment of the of this disclosure, describing Design-For-Test (DFT) methodology of a semiconductor chip, including a macro isolation check process.

FIG. 2 illustrates a method 200 describing DFT methodology of the semiconductor chip 100, in an embodiment of this disclosure. At step 202, DFT synthesis of a netlist of the semiconductor chip 100 is implemented. Here, the method 200 inserts two steps into the DFT methodology, a macro isolation check step 204 and a feedback step 206, between the DFT synthesis step 202 and DFT verification step 208. At step 204, the process checks for isolation of test Input/Output (I/O) of the macro 106 (FIG. 1) to a chip test I/O. This step indicates confirming a link between the test I/O of the macro 106 and the chip test I/O, by comparing attributes, i.e., test flags associated with test I/O of the macro 106 and the chip test I/O, which can be used to control the test I/O of the macro 106. Further, step 204 checks for isolation of each test I/O of the macro 106 to a number of chip test I/Os. Step 204 can be easily integrated into any design for a test tool, providing a simple and time saving process for parsing the netlist. Based on the results of step 204, step 206 provides feedback to the designer and the test synthesis engineer regarding any identified mismatches. The feedback provided at step 206 helps in carrying out the DFT verification, at step 208. Step 204 is described below in detail, with reference to FIG. 3 and FIG. 4.

Figure 3:
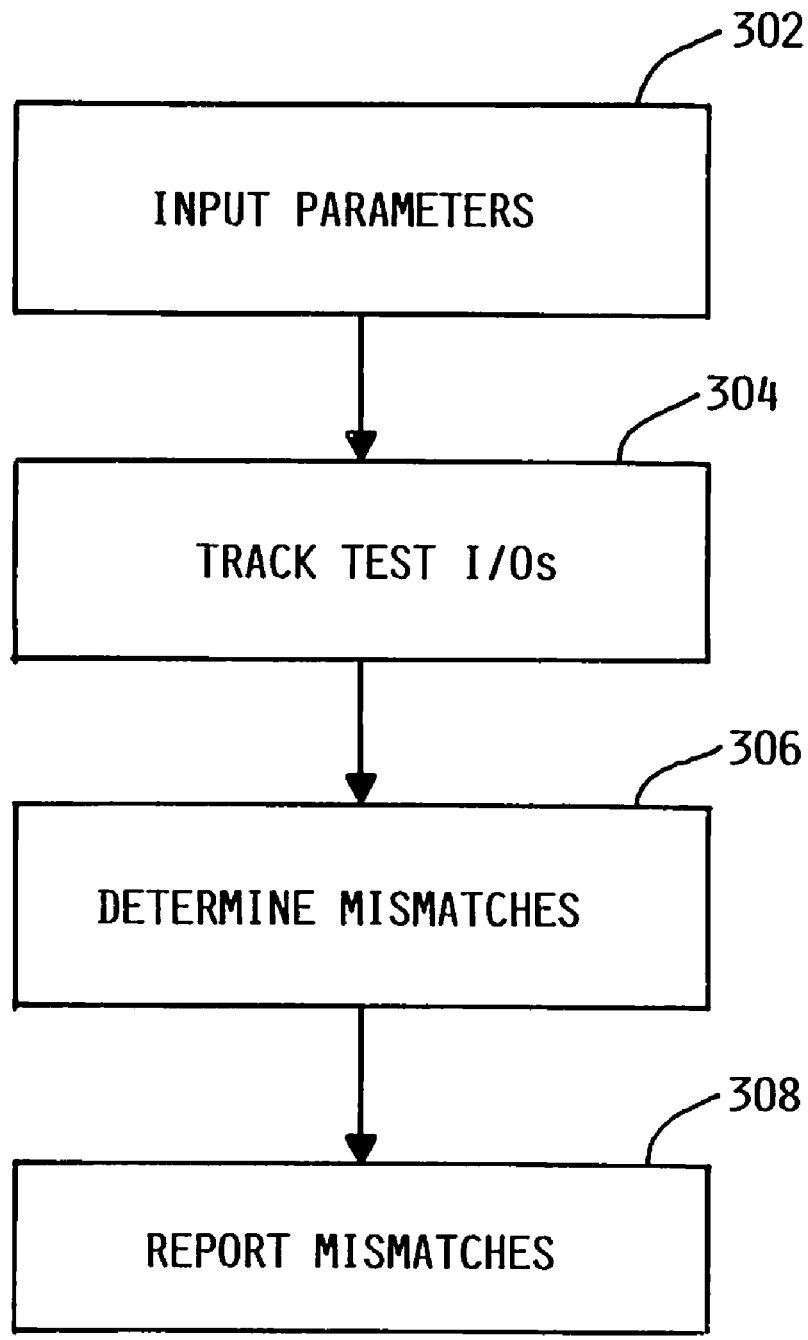
FIG. 3 is a flow chart of an embodiment of this disclosure, describing macro isolation check process performed on the semiconductor chip after DFT synthesis.

FIG. 3 describes a method 300 for the macro isolation check, performed as shown at step 204 in the embodiment set out in FIG. 2. The method is performed by a test tool 500, shown in FIG. 5. At step 302, the test tool 500, receives parameters as input, such as a test Input/Output (I/O) name of the macro 106, associated attributes of the test I/O, and the netlist for the semiconductor chip 100. At step 304, the test tool 500 tracks the test I/O of the macro 106 (FIG. 1) to a chip test I/O. At step 306, the test tool 500 determines any mismatches between the attributes associated with the test I/O of the macro 106 and attributes associated with the chip test I/O. Finally, at step 308, the test tool 500 reports all mismatches.

Figure 4A:
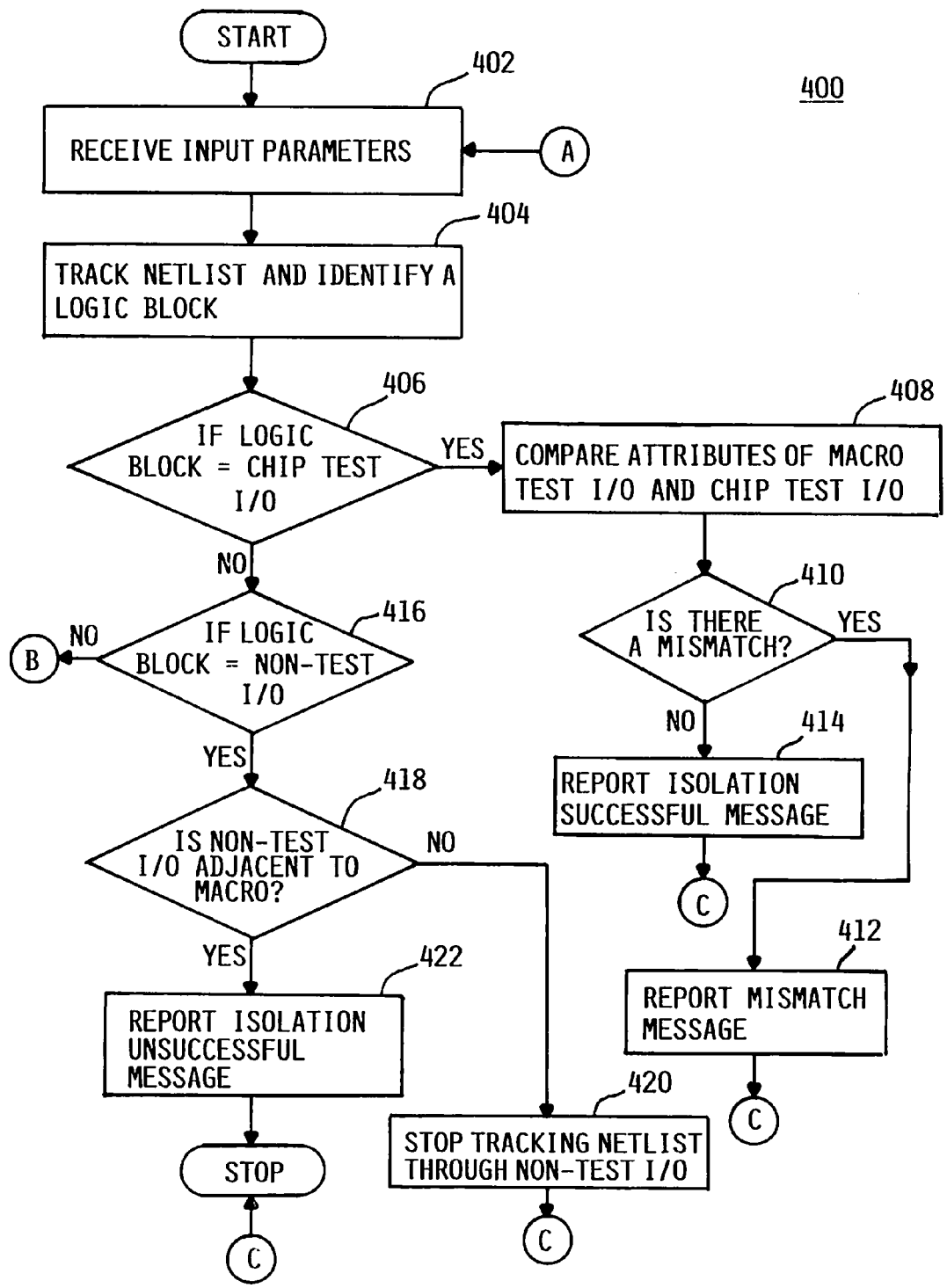
FIG. 4A and FIG. 4B depict an alternative embodiment depicting a flow chart, describing the process of implementation of the macro isolation check as claimed below.
Figure 4B:
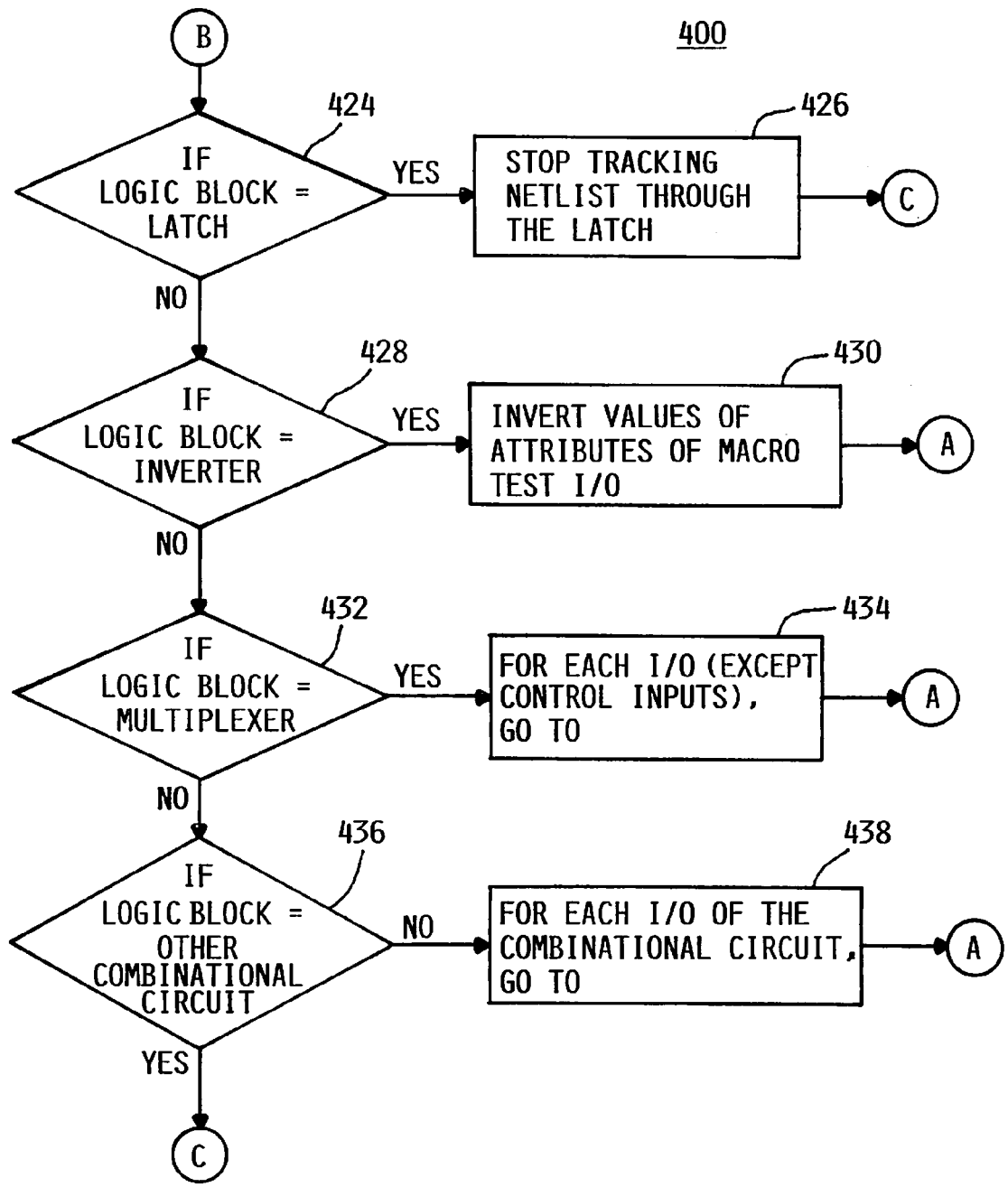
Figure 5:
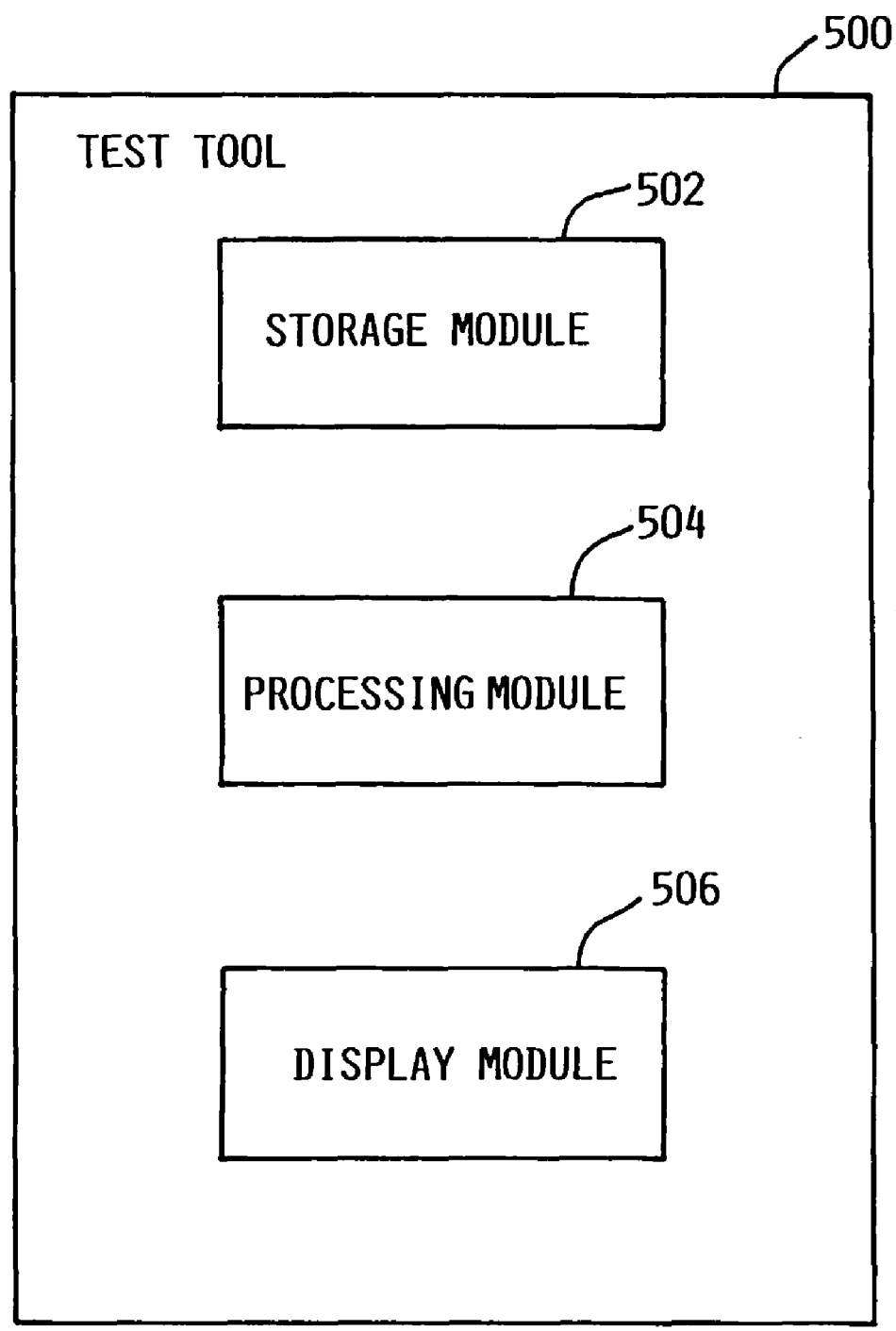
FIG. 5 is a block diagram of an embodiment of a system for practicing the methods of this disclosure.

FIG. 4A and FIG. 4B depict alternate embodiments of a method for the macro isolation check, performed as shown at step 204, in FIG. 2. FIG. 4A and FIG. 4B illustrate a generic flowchart of a method 400 that applies to two different scenarios, depending on whether an input parameter called I/O type received by the test tool 500, in FIG. 5, is "input" or "output". In each scenario, the macro isolation check occurs from test input or test output of the macro 106 (FIG. 1), depending on the I/O type. Details of the steps followed in the two scenarios are described below.

The method 400 elaborates the step 204, of FIG. 2, for the macro isolation check of a test Input/Output (I/O), and this method can be repeated for all test I/Os of the macro 106. Further, in an alternate embodiment featuring multiple macros on a semiconductor chip, the test tool 500 implements the method 400 for all the macros on the semiconductor chip. The macro isolation check of a test I/O of the macro 106 to chip test I/O(s) is set forth below.

At step 402, FIG. 4A, the test tool 500 in FIG. 5 receives parameters, such as a test I/O name of the macro 106, associated attributes, also referred to as a first set of attributes, of the test I/O, I/O type, and the netlist of the semiconductor chip 100, as input. A sample input of this nature might be "Macro/E, +TI, +SE, input and netlist_xyz( )", where the test I/O name of the macro 106 is "Macro/E", associated attributes are "+TI (Test Inhibit)" and "+SE (Scan Enable)", I/O type is "input", and the netlist is "netlist_xyz( )".

The test tool 500 follows different process flows for isolation check of test input (of the macro 106) to a chip test I/O, and isolation check of test output (of the macro 106) to a chip test I/O. Each test input of the macro 106 receives input from a single logic block, but, each test output of the macro 106 can fan out to multiple logic blocks. The test tool 500 implements the process flow associated with the test input using a SEARCH_BACK function, and the process flow associated with the test output using a SEARCH_FORWARD function. When the test tool 500 receives "input" as the I/O type, the test tool 500 calls the SEARCH_BACK function with the test input name of the macro 106 and the associated attributes of the test input. Further, the test tool 500 calls the SEARCH_BACK function for all test inputs of the macro 106, with their corresponding names and associated attributes. Correspondingly, when the test tool 500 receives "output" as the I/O type, the test tool 500 calls the SEARCH_FORWARD function with the test output name of the macro 106 and the associated attributes of the test output. Further, the test tool 500 calls the SEARCH_FORWARD function for all test outputs of the macro 106, with their corresponding names and associated attributes. Each of these functions is set forth below.

When "input" is received as the I/O type, at step 402, the test tool 500 assigns the variables I1 and F1 associated with the SEARCH_BACK function with values of the test input name of the macro 106 and the associated attributes, respectively. At step 404, the SEARCH_BACK function tracks the netlist of the semiconductor chip 100 from the test input of the macro 106, and identifies a logic block that provides I1 to the macro 106, from the set of logic blocks 102.

At step 406, the SEARCH_BACK function checks whether the logic block identified at step 404, is a chip test I/O. If the logic block is identified as a chip test I/O, the SEARCH_BACK function compares the value of F1 with the attributes associated, also referred to as a second set of attributes, with the chip test I/O to determine whether a mismatch is found, at step 408. If a mismatch is detected between F1 and the attributes associated with the chip test I/O at step 410, the SEARCH_BACK function reports a mismatch message, at step 412 and stops tracking the netlist through the chip test I/O. The mismatch message includes a port name where the mismatch has been detected along with all mismatch details. On the other hand, if a match is detected between F1 and the attributes associated with the chip test I/O at step 408, the SEARCH_BACK function reports an isolation successful message for the particular test input, at step 414 and stops tracking the netlist through the chip test I/O. The isolation successful message confirms that the attributes provided to the chip test I/O have propagated to the macro 106.

If the logic block is not identified as a chip test I/O at step 406, the SEARCH_BACK function determines whether the logic block is a non-test I/O, at step 416. If the logic block is identified as a non-test I/O, at step 418, the SEARCH_BACK function checks whether the non-test I/O is adjacent to the macro 106. If the non-test I/O is adjacent to the macro 106, the SEARCH_BACK function reports an isolation unsuccessful message for the particular test input of the macro 106, at step 422. If the non-test I/O is not adjacent to the macro 106, at step 420, the SEARCH_BACK function stops tracking back the chip test I/O through the non-test I/O, because the non-test I/O has no test significance.

If the logic block is identified neither as a chip test I/O, nor as a non-test I/O, the SEARCH_BACK function checks whether the logic block is a latch, at step 424. If the logic block is identified as a latch, the SEARCH_BACK function stops tracking back from the latch at step 426, as presence of the latch does not allow the chip test I/O to directly control test I/O of the macro 106.

If the logic block is not identified as a latch at step 424, the SEARCH_BACK function checks whether the logic block is an inverter, at step 428. If the logic block is identified as an inverter, the SEARCH_BACK function inverts the value of F1 at step 430, as all signals passing through the inverter are inverted. Thereafter, the test tool 500 calls the SEARCH_BACK function again with input name of the inverter as I1 and associated attributes as inversion of F1.

If the logic block is not identified as an inverter at step 428, the SEARCH_BACK function checks whether the logic block is a multiplexer, at step 432. If the logic block is identified as a multiplexer, the test tool 500 calls the SEARCH_BACK function from all inputs of the multiplexer except for all control inputs of the multiplexer, at step 434, because the control inputs are signals that help in mapping the inputs to outputs of the multiplexer. The test tool 500 calls the SEARCH_BACK function for all inputs of the multiplexer with the input names as I1 and associated attributes as F2 to identify chip test I/O(s) in the netlist.

Finally, if the logic block is not identified as a multiplexer at step 432, the SEARCH_BACK function checks whether the logic block is some other combinational circuit, at step 436. If the logic block is identified as some other combinational circuit, the test tool 500 calls the SEARCH_BACK function from all inputs of the combinational circuit, at step 434. At step 402, the test tool 500 accepts input names of all inputs of the combinational circuit as I1 and their corresponding attributes as F1. As each input of the combinational circuit is connected to another logic block of the semiconductor chip 100, the SEARCH_BACK function needs to track the netlist of the semiconductor chip 100 through each input of the combinational circuit to identify a possible chip test I/O. Hence, the test tool 500 executes the SEARCH_BACK function for all inputs of the combinational circuit. The combinational circuit may be a logic gate, or may be a combination of logic gates. For example, if the combinational circuit is an AND gate, the SEARCH_BACK function is called for both the inputs of the AND gate. At step 402, the test tool 500 accepts input names of both the inputs of the AND gate as I1 and the associated flags for both inputs as F1.

Returning to the top of the method 400, when the I/O type provided at step 402 is "output", the test tool 500 calls the SEARCH_FORWARD function. At step 402, the SEARCH_FORWARD function assigns variables O2 and F2 with the values of test output name of the macro 106 and the associated attributes, such as, test flags respectively. At step 404, the SEARCH_FORWARD function identifies the number of fan outs from the test output of the macro 106. In contrast to the SEARCH_BACK function, the steps following step 404 in the SEARCH_FORWARD function are repeated for the number of fan outs from the test output O2 of the macro 106. Further, at step 404, the SEARCH_FORWARD function tracks the netlist of the semiconductor chip 100 and identifies a logic block that receives an input from O2, from the set of logic blocks 104.

At step 406, the SEARCH_FORWARD function checks whether the logic block is a chip test I/O. If the logic block is identified as a chip test I/O at step 406, the SEARCH_FORWARD function compares the value of F2 with the attributes associated with the chip test I/O, at step 408. If the value of F2 matches with the value of the attributes associated with the chip test I/O, then at step 414, the SEARCH_FORWARD function reports an isolation successful message for the particular test output of the macro 106 and stop tracking the netlist through the chip test I/O. However, if the value of F2 does not match with the value of the attributes associated with the chip test I/O, the test tool 500 reports a mismatch message at step 412, as described earlier.

The SEARCH_FORWARD function works in tandem with the SEARCH_BACK when the logic block is identified as a non-test I/O or as a latch. If the logic block is not identified as a latch at step 424, the SEARCH_FORWARD function checks whether the logic block is an inverter, at step 428. If the logic block is identified as an inverter, the SEARCH_FORWARD function inverts the value of F2. Thereafter, the test tool 500 calls the SEARCH_FORWARD function again with the test output name of the inverter as O2 and associated attributes as inversion of F2, at step 402. If the logic block is not identified as an inverter at step 428, the SEARCH_FORWARD function verifies whether the logic block is a multiplexer at step 432. If the logic block is identified as a multiplexer, the test tool 500 calls the SEARCH_FORWARD function from all outputs of the multiplexer with the output name of the multiplexer as O2 and associated attributes as F2. If the logic block is not identified as a multiplexer at step 432, the SEARCH_FORWARD function checks whether the logic block is some other combinational circuit, at step 436. If the logic block is identified as some other combinational circuit, the test tool 500 calls the SEARCH_FORWARD function for all outputs of the combination circuit, at step 438. At step 402, the test tool 500 accepts output names of all outputs of the combinational circuit as O2 and their corresponding attributes as F2. The SEARCH_BACK and SEARCH_FORWARD function described above are repeated for all test I/Os of the macro 106 to complete the macro isolation check of the macro 106.

FIG. 5 illustrates an embodiment of the test tool 500. The test tool 500 is configured to implement the methods shown in FIG. 3 and FIG. 4. The test tool 500 may include a storage module 502, a processing module 504 and a display module 506, and it is operatively coupled to the storage module 502 and the display module 506. The test tool 500 may be an electronic design automation (EDA) tool, of any of the types well known in the art, as discussed above. The test tool 500 may be programmed and configured, employing any of a number of conventional methods, to perform the steps of the processes set out above.

The storage module 502 can store a set of parameters, related to a macro test I/O on a semiconductor chip, including the macro test I/O name, along with associated attributes, I/O type and a netlist of the semiconductor chip, as explained in connection with step 302, FIG. 3. The processing module 504 is configured to track a test I/O of the macro to a chip test I/O, step 304 in FIG. 3. Further, the processing module 504 compares attributes associated with the test I/O of the macro with attributes of the chip test I/O, as set out in connection with step 306, FIG. 3. Based on the comparison by the processing module 504, the display module 506 reports a match or mismatch of the attributes associated with the test I/O of the macro and the chip test I/O, step 308 in FIG. 3.

As the processing module 504 tracks the chip test I/O, it also identifies all logic blocks in the netlist of the semiconductor chip. If the logic block identified by the processing module 504 is a non-test I/O, the processing module 504 stops tracking the chip test I/O in the netlist. Further, the processing module 504 is configured to determine whether the non-test I/O identified is adjacent to the macro. If the non-test I/O is adjacent to the macro, the display module 506 reports an isolation unsuccessful message for the particular test input of the macro. If the logic block identified by the processing module 504 is an inverter, the processing module 504 is configured to invert the value of the attributes associated with the test I/O of the macro. If the logic block is identified as a multiplexer, the processing module 504 continues tracking the chip test I/O through all I/Os of the multiplexer, except for all the control signals of the multiplexer. However, if the logic block identified by the processing module 504 is some other combinational circuit, the processing module 504 continues tracking the chip test I/O through all I/O of the combinational circuit. Moreover, the test tool 500 helps in isolation check for each test I/O of the macro 106 to a multitude of chip test I/O(s). Others of the processes set out above can be similarly replication by appropriate configuration, as will be apparent to those in the art.

It should be noted that the materials set out above constitute functional descriptions of the various embodiments of methods of this disclosure. Those of skill in the art will be able to put those descriptions into concrete form, using a variety of computer languages, coding languages, methods and tools. No best method for performing this process is known, and it is believed that any of the well-known methods and formats available to the art will suffice to produce operating examples of systems embodying the claimed invention.

Thus, it is apparent that there has been provided, with various embodiments of the invention, a methodology for confirming isolation of each test I/O of the macro 106 to chip test I/O(s) that satisfies the advantages set forth above. Although the invention has been described in detail, it should be understood that various changes, substitutions, and alterations may be readily ascertainable by those skilled in the art and such alterations may be made without departing from the spirit and scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for testing a semiconductor chip design, wherein the chip includes a plurality of macros, each said macro including a respective pre-synthesized reusable circuit block having a respective at least one macro test input/output (I/O), and the method is included in a Design-For-Test (DFT) methodology, the method comprising:

receiving as input in an electronic design automation (EDA) system a netlist for said semiconductor chip design and a respective set of parameters related to each of at least some of said plurality of macro test input/output (I/O)s, wherein each said respective set of parameters includes the respective macro test I/O name and a respective first set of attributes associated with the corresponding macro test I/O;

responsive to receiving as input a netlist for said semiconductor chip design and a respective set of parameters related to each of at least some of said plurality of macro test I/Os, tracking using the EDA system each macro test I/O of said at least some of said plurality of macro test I/Os to a corresponding at least one chip test I/O, wherein each chip test I/O is included in the netlist;

responsive to tracking each macro test I/O to a corresponding at least one chip test I/O, determining using the EDA system, for each macro test I/O of said at least some of said plurality of macro test I/Os, any mismatches between the respective first set of attributes associated with the corresponding macro test I/O and a respective second set of attributes associated with the corresponding at least one chip test I/O; and reporting using the EDA system the mismatches between a respective first set of attributes and the corresponding second set of attributes.

2. The method of claim 1, wherein the tracking step includes identifying a respective logic block in the netlist between each of at least one macro test I/O and the corresponding chip test I/O.

3. The method of claim 1, wherein the first set of attributes and the second set of attributes are test flags.

4. The method of claim 1, wherein the step of tracking includes tracking each of at least some macro test I/O to a plurality of chip test I/Os.

5. The method of claim 2, further including inverting the value of attributes associated with a specific logic block, upon identification of the logic block as an inverter.

6. The method of claim 2, further includes:
terminating tracking through the logic block upon identification of the logic block as a non-test I/O; and
reporting an error message if the non-test I/O is adjacent to the macro test I/O.

7. The method of claim 2, further includes tracking the macro test I/O to the corresponding chip test I/O from each input/output of the logic block, upon identification of the logic block as a combinational circuit.

8. The method of claim 2, further includes tracking the macro test I/O to the corresponding chip test I/O from each input/output of the logic block, upon identification of the logic block as a multiplexer, wherein the tracking is performed without reference to control signals from the multiplexer.

9. A system for implementing a step of design-for-test methodology for testing a semiconductor chip design, comprising:
a storage module configured to store design data for said semiconductor chip design, said design data specifying a plurality of macros, each said macro including a respective pre-synthesized reusable circuit block having a respective at least one macro test input/output (I/O), said design data further specifying a netlist for said semiconductor chip design and a respective set of parameters related to each of at least some of the plurality of macro test Input/Output (I/O)s of the semiconductor chip, wherein each said respective set of parameters includes a respective macro test I/O name and a respective first set of attributes associated with the corresponding macro test I/O;
a processing module operatively coupled to the storage module and configured to:
receive as input the respective set of parameters related to each of at least some of said plurality of macro test I/Os;
responsive to receiving as input the respective set of parameters related to each of at least some of said plurality of macro test I/Os, track each macro test I/O of said at least some of said plurality of macro test I/Os to a corresponding at least one chip test I/O, wherein each chip test I/O is included in the netlist;
responsive to tracking each macro test I/O to a corresponding at least one chip test I/O determine, for each macro test I/O of said at least some of said plurality of macro test I/Os, any mismatches between the respective first set of attributes associated with the corresponding macro test I/O and a respective second set of attributes associated with the corresponding at least one chip test I/O; and
a display module operatively coupled to the processing module and configured to display mismatches between a respective first set of attributes and the corresponding second set of attributes.

10. The system of claim 9, wherein the processing module is further configured to identify a respective logic block in the netlist between each of at least one macro test I/O and the corresponding chip test I/O.

11. The system of claim 10, wherein the processing module is further configured to terminate all processing steps for the respective logic block upon identification of the respective logic block as a non-test I/O.

12. The system of claim 10, wherein the processing module is further configured to invert the respective first set of attributes upon identification of the respective logic block as an inverter.

* * * * *